(12) United States Patent
Foulke et al.

(10) Patent No.: US 6,170,737 B1
(45) Date of Patent: Jan. 9, 2001

(54) SOLDER BALL PLACEMENT METHOD

(75) Inventors: Richard F. Foulke, Stoneham; Richard F. Foulke, Jr., Westford; Cord W. Ohlenbusch, Andover, all of MA (US)

(73) Assignee: Speedline Technologies, Inc., Franklin, MA (US)

( * ) Notice: Under 35 U.S.C. 154(b), the term of this patent shall be extended for 0 days.

(21) Appl. No.: 09/090,120

(22) Filed: Jun. 4, 1998

Related U.S. Application Data

(63) Continuation of application No. 08/795,543, filed on Feb. 6, 1997, now abandoned.

(51) Int. Cl.[7] .................................................. B23K 35/12
(52) U.S. Cl. ............................ 228/245; 228/41; 228/56.3; 228/8; 228/105; 228/246; 228/180; 228/253
(58) Field of Search .............................. 228/41, 56.3, 8, 228/105, 245, 246, 180, 253

(56) References Cited

U.S. PATENT DOCUMENTS

| | | | |
|---|---|---|---|
| 3,472,365 | 10/1969 | Tiedema et al. | 206/56 |
| 3,589,000 | 6/1971 | Galli | 29/590 |
| 4,209,893 | 7/1980 | Dyce et al. | 29/522 R |
| 4,216,350 | 8/1980 | Reid | 174/68.5 |
| 4,437,232 | 3/1984 | Araki et al. | 29/740 |
| 4,684,055 | 8/1987 | Baer et al. | 228/180.1 |
| 4,712,721 | 12/1987 | Noel et al. | 228/56.3 |
| 4,722,470 | 2/1988 | Johary | 228/180.2 |
| 4,733,823 | 3/1988 | Waggener et al. | 239/601 |
| 4,842,184 | 6/1989 | Miller, Jr. | 228/180.1 |
| 4,872,261 | 10/1989 | Sanyal et al. | 29/840 |
| 4,898,320 | 2/1990 | Dunaway et al. | 228/245 |
| 4,903,889 | 2/1990 | Svendsen et al. | 228/180.2 |
| 4,906,823 | 3/1990 | Kushima et al. | 228/245 |
| 5,029,748 | 7/1991 | Lauterbach et al. | 228/180.1 |
| 5,048,747 | 9/1991 | Clark et al. | 228/180.2 |
| 5,108,024 | 4/1992 | Kazem-Goudarzi et al. | 228/104 |
| 5,118,027 | 6/1992 | Braun et al. | 228/180.2 |
| 5,118,584 | 6/1992 | Evans et al. | 430/313 |
| 5,148,375 | 9/1992 | HOrikami | 364/552 |
| 5,172,853 | 12/1992 | Maiwald | 228/248 |
| 5,205,896 | 4/1993 | Brown et al. | 156/297 |

(List continued on next page.)

FOREIGN PATENT DOCUMENTS

| | | |
|---|---|---|
| 0259102 | 8/1987 | (EP) . |
| 2177642 | 1/1987 | (GB) . |
| 2284933 | 6/1995 | (GB) . |
| 6310515 | 11/1994 | (JP) . |
| 7103739 | 4/1995 | (JP) . |
| 8008523 | 1/1996 | (JP) . |
| 8264930 | 1/1996 | (JP) . |
| 8112671 | 5/1996 | (JP) . |
| 8153957 | 6/1996 | (JP) . |
| 8153959 | 6/1996 | (JP) . |
| 8162493 | 6/1996 | (JP) . |
| 8162494 | 6/1996 | (JP) . |
| 8236916 | 9/1996 | (JP) . |
| 8242070 | 9/1996 | (JP) . |
| 9186165 | 7/1997 | (JP) . |
| 9191027 | 7/1997 | (JP) . |
| 9223712 | 8/1997 | (JP) . |
| 9246422 | 9/1997 | (JP) . |
| WO 94/28580 | 12/1994 | (WO) . |
| WO 97/25175 | 1/1997 | (WO) . |
| WO 96/09744 | 3/1999 | (WO) . |

*Primary Examiner*—Patrick Ryan
*Assistant Examiner*—M. Alexandra Elve
(74) *Attorney, Agent, or Firm*—Hamilton, Brook, Smith & Reynolds, P.C.

(57) ABSTRACT

An apparatus for placing an array of solder balls on a substrate includes a carrier plate having an array of holes therethrough. Each hole is capable of holding a solder ball. A ball placement head having an array of pins is aligned with a desired pattern of solder balls held by the carrier plate. The array of pins push the pattern of solder balls through the holes in the carrier plate onto the substrate.

13 Claims, 16 Drawing Sheets

U.S. PATENT DOCUMENTS

| | | | |
|---|---|---|---|
| 5,211,328 | 5/1993 | Ameen et al. | 228/180.2 |
| 5,219,117 | 6/1993 | Lin | 228/253 |
| 5,220,200 | 6/1993 | Blanton | 257/778 |
| 5,254,362 | 10/1993 | Shaffer et al. | 427/96 |
| 5,261,593 | 11/1993 | Casson et al. | 228/180.22 |
| 5,275,970 | 1/1994 | Itoh et al. | 437/183 |
| 5,284,287 | 2/1994 | Wilson et al. | 228/180.2 |
| 5,289,631 | 3/1994 | Koopman et al. | 29/840 |
| 5,323,947 | 6/1994 | Juskey et al. | 228/56.3 |
| 5,356,658 | 10/1994 | Hertz et al. | 427/96 |
| 5,356,838 | 10/1994 | Kim | 437/226 |
| 5,363,277 | 11/1994 | Tanaka | 361/760 |
| 5,373,984 | 12/1994 | Wentworth | 228/180.1 |
| 5,388,327 | 2/1995 | Trabucco | 29/830 |
| 5,431,332 | 7/1995 | Kirby et al. | 228/246 |
| 5,438,223 | 8/1995 | Higashi et al. | 257/774 |
| 5,442,852 | 8/1995 | Danner | 29/843 |
| 5,445,313 | 8/1995 | Boyd et al. | 228/248.1 |
| 5,449,487 | 9/1995 | McGill | 53/473 |
| 5,467,913 | 11/1995 | Namekawa et al. | 228/41 |
| 5,492,266 | 2/1996 | Hoebener et al. | 228/248.1 |
| 5,497,938 * | 3/1996 | McMahon et al. | 228/253 |
| 5,499,487 | 3/1996 | McGill . | |
| 5,504,277 | 4/1996 | Danner | 174/261 |
| 5,511,306 | 4/1996 | Denton et al. | 29/840 |
| 5,519,580 | 5/1996 | Natarajan et al. | 361/760 |
| 5,540,377 | 7/1996 | Ito | 228/41 |
| 5,547,530 | 8/1996 | Nakamura et al. | 156/89 |
| 5,551,216 | 9/1996 | McGill . | |
| 5,574,801 | 11/1996 | Collet-Beillon | 382/150 |
| 5,601,229 | 2/1997 | Nakazato et al. | 288/246 |
| 5,607,099 | 3/1997 | Yeh et al. | 228/180.22 |
| 5,620,129 | 4/1997 | Rogren | 228/56.3 |
| 5,620,927 | 4/1997 | Lee | 29/841 |
| 5,626,277 | 5/1997 | Kawada | 228/41 |
| 5,637,832 | 6/1997 | Danner | 174/260 |
| 5,643,831 | 7/1997 | Ochiai et al. | 437/183 |
| 5,655,704 | 8/1997 | Sakemi et al. | 228/246 |
| 5,657,528 | 8/1997 | Sakemi et al. | 29/430 |
| 5,658,827 | 8/1997 | Aulicino et al. | 228/180.22 |
| 5,662,262 | 9/1997 | McMahon et al. | 228/56.3 |
| 5,680,984 | 10/1997 | Sakemi | 228/246 |
| 5,685,477 * | 11/1997 | Mallik et al. | 228/254 |
| 5,704,536 | 1/1998 | Chen et al. | 228/41 |
| 5,765,744 | 6/1998 | Tatumi et al. | 228/254 |

* cited by examiner

SOLDER BALL PLACEMENT METHOD

RELATED APPLICATION

This application is a continuation of U.S. patent application Ser. No. 08/795,543, filed on Feb. 6, 1997, abandoned the entire teachings of which are incorporated herein by reference.

BACKGROUND OF THE INVENTION

In the manufacture of semiconductor devices, it is common to place small solder balls upon the substrate of the semiconductor device in a ball grid array and then reflow the solder balls in an oven to provide a series of electrical connections on the substrate. Currently, there are several different approaches for placing solder balls to form ball grid arrays onto semiconductors and other electrical devices.

In one approach, an array of solder balls is picked up with a vacuum head. Each solder ball is held by a separate vacuum nozzle in the vacuum head. The vacuum head then places the solder balls on the semiconductor substrate and releases the solder balls thereon.

In another approach, a mask is placed over the semiconductor substrate. The mask has an array of openings formed therethrough corresponding to the desired pattern of electrical connections on the substrate. A quantity of solder balls is then spread across the mask with an air knife or a squeegee. Some of the solder balls fall into and are captured by the openings in the mask thereby positioning the solder balls in the desired pattern on the substrate.

In still another approach, a transfer substrate is formed with an array of indentations corresponding to the desired pattern of electrical connections on the substrate. The array of indentations is then filled with solder balls. The semiconductor substrate is brought face down into contact with the array of solder balls lying on the transfer substrate. The solder balls are then reflowed and metallurgically bonded to the semiconductor substrate.

SUMMARY OF THE INVENTION

In some applications, as many as 1000 solder balls about 0.020 inches to 0.030 inches in diameter are placed on a semiconductor substrate in an area of about four square inches. As a result, the large number of small sized solder balls makes it sometimes difficult to consistently place a full array of solder balls on a semiconductor substrate with current machinery.

The present invention provides an apparatus for placing an array of solder balls on a semiconductor substrate which is more reliable in the placement of the solder balls than previous approaches. The present invention apparatus includes a carrier plate having a series of holes therethrough. Each hole is capable of holding a solder ball. At least a portion of a first pattern of protrusions on a ball placement head is aligned with a first pattern of solder balls held by the carrier plate. The protrusions push the first pattern of solder balls through the holes in the carrier plate onto the substrate.

In preferred embodiments, a solder ball feed fills the carrier plate with solder balls. The feed includes a compliant wiping element for wiping excess solder balls from the carrier plate. A second pattern of protrusions on a pattern head is aligned with some of the solder balls held by the carrier plate for pushing a second pattern of solder balls from the carrier plate so that only the first pattern of solder balls remains held by the carrier plate. Each protrusion on the ball placement and pattern heads is a pin which is self-aligning with a corresponding hole in the carrier plate.

A first sensing system senses whether all the required holes in the carrier plate contain a solder ball after being filled by the solder ball feed. The first sensing system includes a vision device and a light positioned behind the carrier plate for back lighting the carrier plate. A second sensing system senses whether the carrier plate contains solder balls only in the first pattern after the pattern head pushes the second pattern of solder balls from the carrier plate. The second sensing system includes a vision device, a light positioned behind the carrier plate for back lighting the carrier plate for detecting whether the carrier plate holds solder balls only in the first pattern, and a light positioned in front of the carrier plate for front lighting the carrier plate for detecting any stray solder balls on top of the carrier plate.

The carrier plate in one preferred embodiment includes a film sandwiched between a first plate portion and a second plate portion. The series of holes in the carrier plate pass through the first plate portion, the film and the second plate portion. The holes in the first and second plate portions are dimensioned to allow passage of the solder balls therethrough while the holes through the film are dimensioned to prevent passage of the solder balls through the film by gravity while allowing passage through the film when pushed by the ball placement head.

The first sensing system, pattern head, second sensing system and ball placement head are arranged in a circular path at a first sensing station, a pattern head station, a second sensing station and a ball placement station, respectively. A rotatable carousel having a support finger for supporting the carrier plate transfers the carrier plate to each station. The carousel provides for simultaneous operation at each station resulting in higher through put.

BRIEF DESCRIPTION OF THE DRAWINGS

The foregoing and other objects, features and advantages of the invention will be apparent from the following more particular description of preferred embodiments of the drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
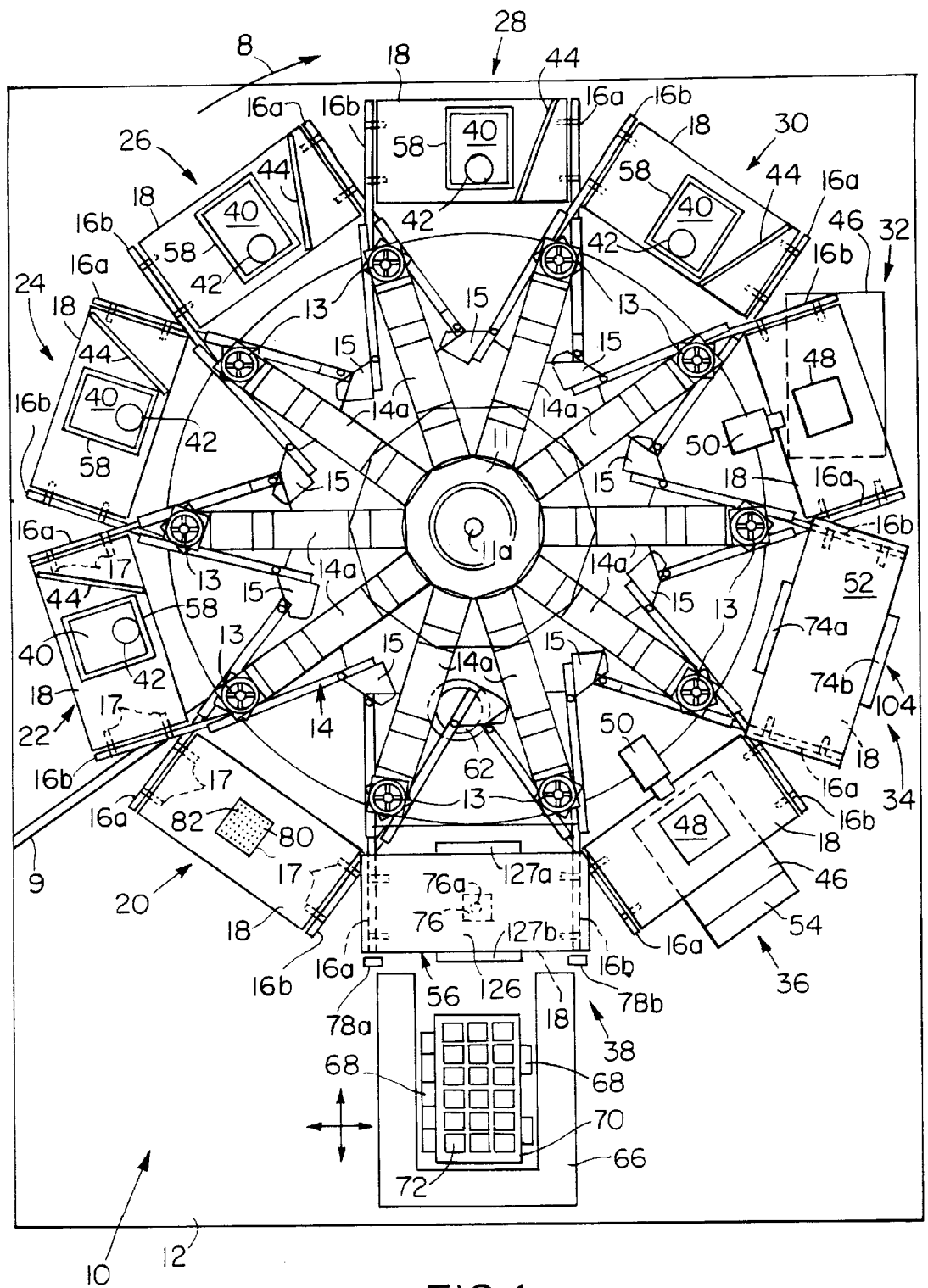
FIG. 1 is a plan view of the present invention solder ball placement apparatus.

Referring to FIG. 1, solder ball placement apparatus 10 includes an indexing carousel 14 which is positioned above a table top 12. Carousel 14 includes ten arms 14a extending outwardly from a central hub 11 which rotates about a rotation point 11a. The arms 14a support ten pairs of spring loaded support fingers 16a and 16b for supporting ten carrier plates 18 with pins 17. Each carrier plate 18 includes an array 80 of holes 82 formed therethrough which support solder balls 102 (FIG. 5) for placement onto a semiconductor substrate part 72. Carousel 14 transfers the ten carrier plates 18 between ten different workstations arranged in a circle by incrementally rotating in the direction of arrow 8 (clockwise).

Apparatus 10 includes a load/unload station 20 at which the carrier plates 18 are loaded or unloaded. Five ball feed stations 22, 24, 26, 28 and 30 are positioned after load/unload station 20 for progressively filling the array 80 of holes 82 in carrier plate 18 with solder balls 102. A first sensing station 32 is positioned after ball feed station 30 for determining whether all the required holes 82 in the array 80 of carrier plate 18 are filled with solder balls 102. A pattern head station 34 is positioned after the first sensing station 32 for creating a desired pattern 81 (FIG. 6) of solder balls 102 by removing a pattern 83 of unneeded solder balls 102 from the array 80 of holes 82. A second sensing station 36 is positioned after the pattern head station 34 for determining whether the desired solder ball 102 pattern 81 has been attained. A ball placement station 38 is positioned after the second sensing station 34 for placing the pattern 81 of solder balls 102 from carrier plate 18 onto a part 72. An X-Y table 66 is positioned adjacent to ball placement station 38 for translating an array of parts 72 held in a JEDEC compatible tray 70 into ball placement station 38.

Figure 2:
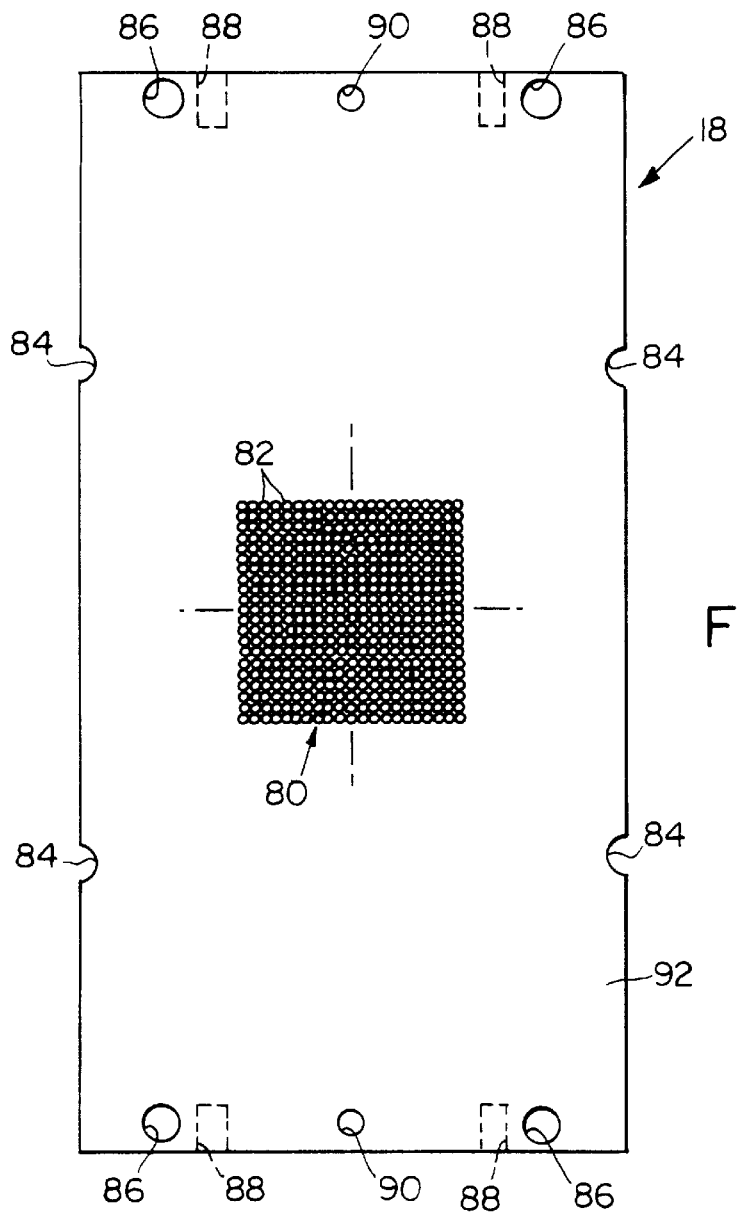
FIG. 2 is a plan view of the carrier plate employed in the present invention apparatus.

In operation, apparatus 10 first must be loaded with at least one and up to ten carrier plates 18 (FIG. 2). This is accomplished by placing a carrier plate 18 at load/unload station 20 between the support fingers 16a/16b and on top of pins 17. The carousel 14 is indexed one increment and the procedure is preferably repeated nine more times.

The following discussion describes the sequence of operations for filling and dispensing solder balls 102 from one carrier plate 18 as the carrier plate 18 is indexed by carousel 14. Carrier plate 18 is supported by support fingers 16a/16b at load/unload station 20 and indexed to ball feed station 22 by carousel 14. Ball feed 40 drops a quantity of Solder balls 102 onto carrier plate 18 for filling the array 80 of holes 82 with solder balls 102. Ball feed station 22 fills the majority of the holes 82 in array 80. Carrier plate 18 is then indexed to ball feed station 24. As carrier plate 18 is indexed, a wiping element 44 wipes solder balls 102 on top of carrier plate 18 which did not fall into a hole 82 from the carrier plate 18. Ball feed stations 24, 26, 28 and 30 repeat the ball feed procedure performed by ball feed station 22 to progressively fill the remaining unfilled holes 82 in array 80 if required. Carousel 14 indexes carrier plate 18 to each station.

Figure 5:
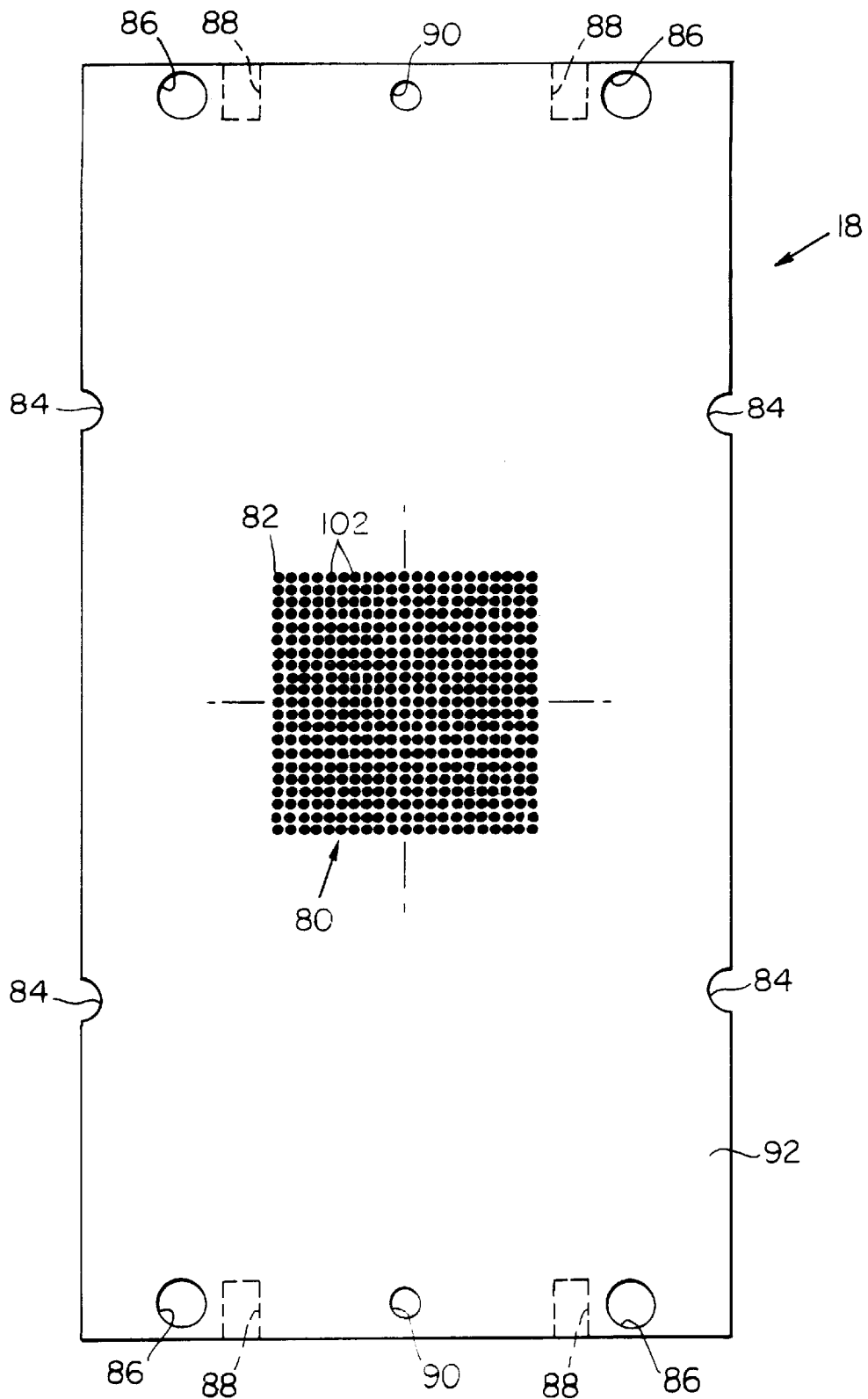
FIG. 5 is a plan view of the carrier plate containing a full array of solder balls.

Carrier plate 18 is indexed from ball feed station 30 to the first sensing station 32 preferably completely filled with solder balls 102 (FIG. 5). Carrier plate 18 is illuminated from below the carrier plate 18 by a light source 46. Camera 50 views the array 80 on carrier plate 18 via mirror 48. If the array 80 of holes 82 is not completely filled as required with solder balls 102, carrier plate 18 is indexed forward to by pass the remaining operations and returns to the ball feed station 22. If the array 80 is completely filled with solder balls 102 as required, carrier plate 18 is indexed to pattern head station 34. Array 80 can have holes 82 which are not filled with solder balls 102 but which also are not part of the desired pattern 81 (discussed below).

Figure 6:
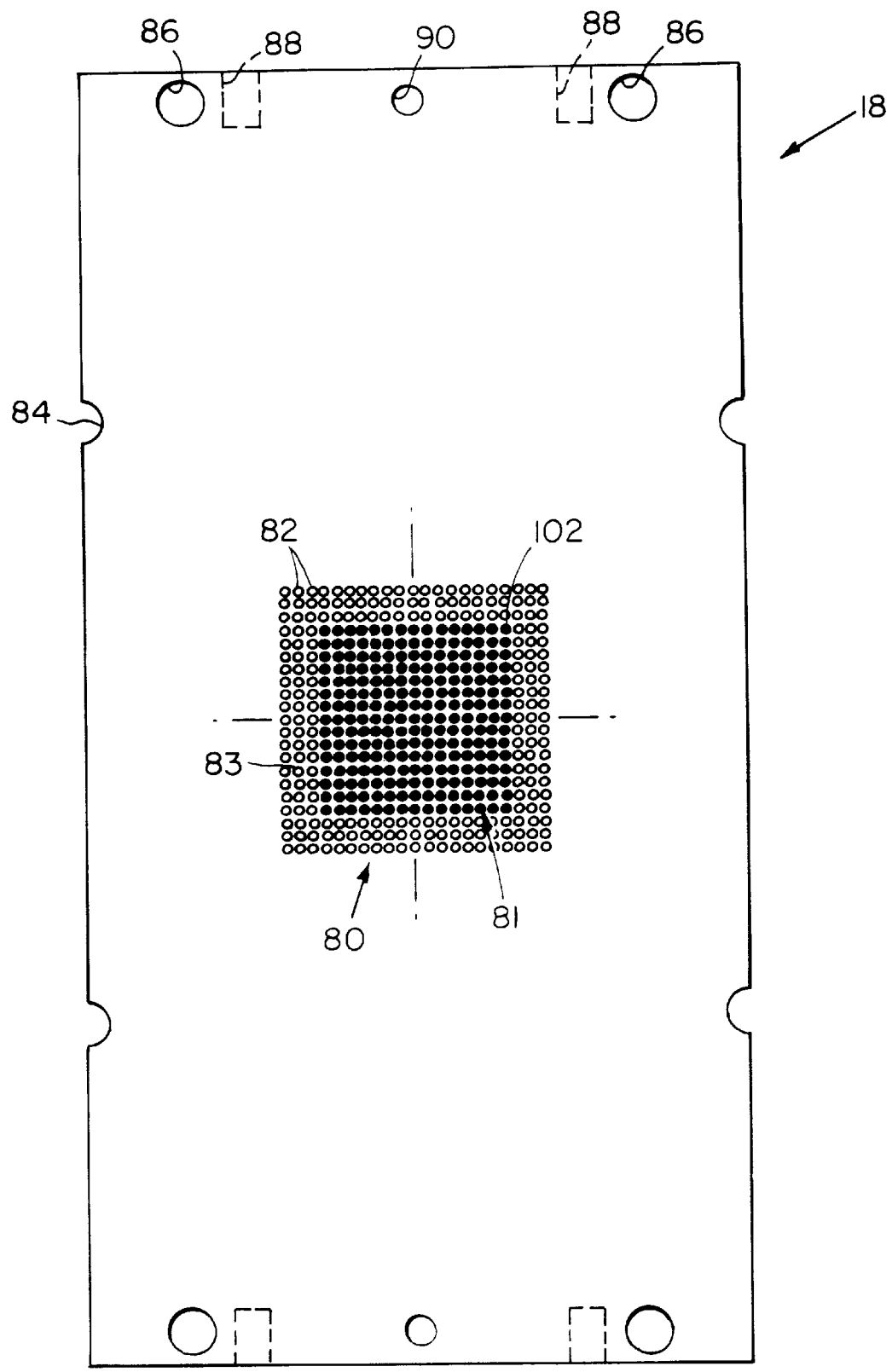
FIG. 6 is a plan view of the carrier plate containing a partial array of a desired pattern of solder balls after removal of unneeded solder balls by the pattern head.

Pattern head station 34 includes a pattern head assembly 52 having a pattern head 104 and pattern head grippers 74a/74b. At pattern head station 34, the pattern head grippers 74a/74b grip the carrier plate 18. Pattern head grippers 74a/74b then lift carrier plate 18 off pins 17 of support fingers 16a/16b bringing the carrier plate 18 upwardly against pattern head 104. Pattern head 104 pushes a predetermined pattern 83 of unneeded solder balls 102 from the array 80 of carrier plate 18 with a series of pins 108 (FIGS. 10 and 11) leaving behind a desired pattern 81 as seen in FIG. 6. Carrier plate 18 is lowered back onto pins 17 of support fingers 16a/16b.

Pattern head grippers 74a/74b then release carrier plate 18 and carousel 14 indexes carrier plate 18 to the second sensing station 36. Carrier plate 18 is illuminated from below by a light source 46 and from above by a light source 54. As in the first sensing station 32, the array 80 on carrier plate 18 is viewed by a camera 50 via mirror 48. Light source 46 enables camera 50 to see whether the solder balls 102 in the array 80 are in the desired pattern 81. Light source 54 enables camera 50 to see whether any stray solder balls 102 are on top of carrier plate 18 which can then be removed, for example, by an air jet or a wiper. If the pattern 81 of solder balls 102 in array 80 is correct, carrier plate 18 is indexed to ball placement station 38. Photo sensors 78a and 78b insure that carrier plate 18 is properly indexed to ball placement station 38.

Ball placement station 38 includes a ball placement head assembly 56 having a ball placement head 126 and ball placement grippers 127a/127b. At ball placement station 38, carrier plate 18 is gripped by ball placement grippers 127a/127b. X-Y table 66 holding a tray 70 of parts 72 with grippers 68 aligns a part 72 underneath array 80 of carrier plate 18. A vacuum chuck 76 located below part 72 moves upwardly and secures part 72 thereon with a vacuum nozzle 76a. Vacuum chuck 76 lifts part 72 slightly above its resting location on tray 70. Finger actuator 62 causes support fingers 16a/16b to open. Ball placement grippers 127a/127b move carrier plate downwardly to a position just above part 72

Figure 18:
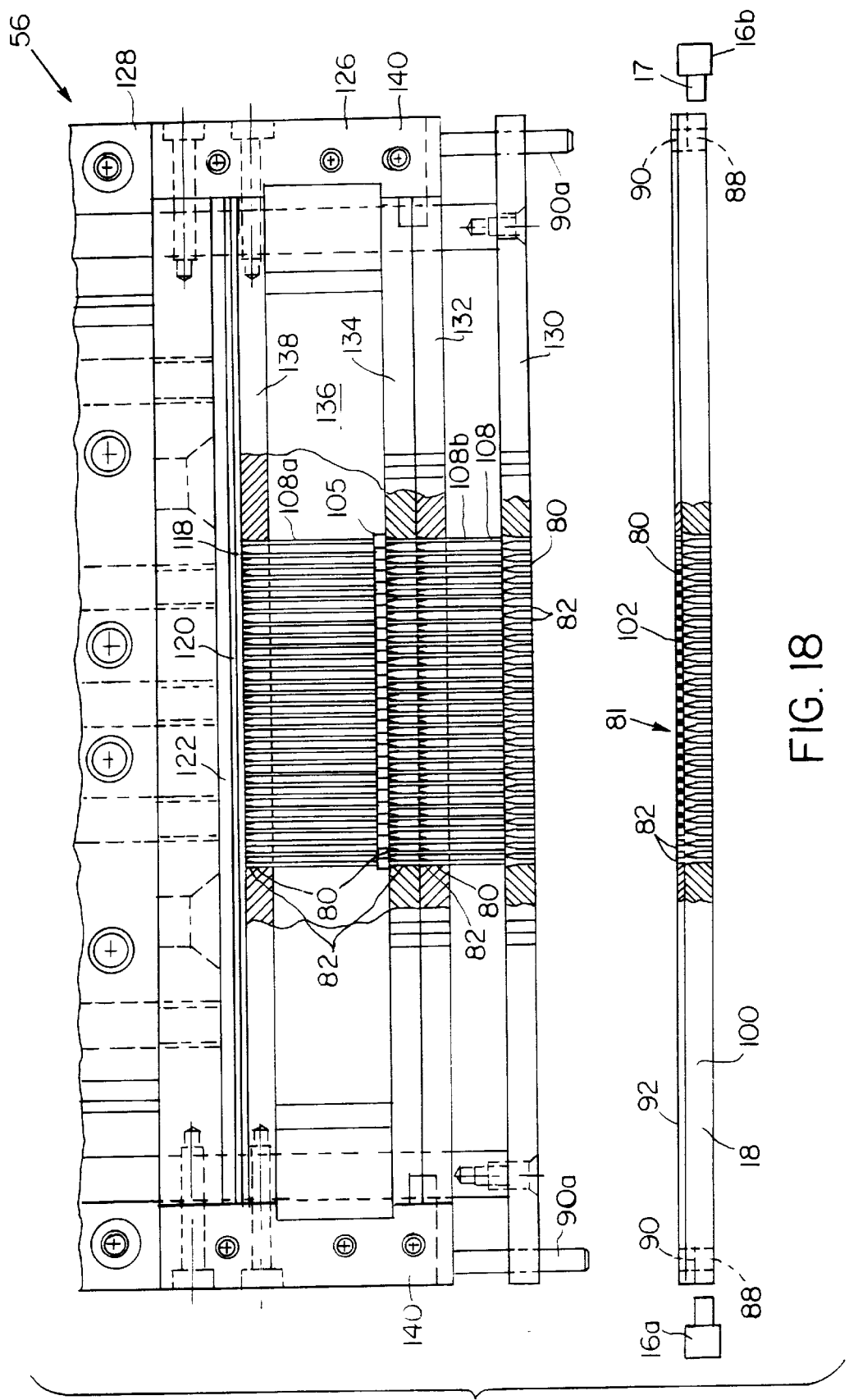
FIG. 18 is a partial side sectional view of the ball placement head positioned above the carrier plate.

(about 0.020 inches above part 72). Ball placement head 126 then moves downwardly relative to carrier plate 18 and pushes the desired pattern 81 (FIG. 6) of solder balls 102 from carrier plate 18 onto part 72 with an array of pins 108 (FIG. 18). The solder balls 102 are positioned onto blobs of flux 72a (FIG. 20) deposited onto part 72 by either a pin transfer process or a screening process. Ball placement head 126 then moves upwardly. Ball placement grippers 127a/127b also move the carrier plate 18 upwardly and the support fingers 16a/16b are closed by finger actuator 62 to support the carrier plate 18. Vacuum chuck 76 moves downwardly to return part 72 to tray 70. Ball placement grippers 127a/127b release carrier plate 18 and carrier plate 18 is then indexed to load/unload station 20 and the cycle is repeated.

The procedures performed by each station 22, 24, 26, 28, 30, 32, 34, 36 and 38 occur simultaneously as carousel 14 incrementally rotates. The X-Y table 66 moves each part 72 in tray 70 under ball placement head 126 until the desired pattern 81 of solder balls 102 is positioned on all the parts. Once this is accomplished, a new tray 70 of parts 72 is loaded into X-Y table 66.

If one of the carrier plates 18 is rejected more than once at either the first sensing station 32 or the second sensing station 36, apparatus 10 can be programmed to notify the machine operator. In such a case, the carrier plate 18 may be deemed defective and replaced with a new carrier plate 18 at load/unload station 20.

A more detailed description of the components of apparatus 10 now follows. Each arm 14a on carousel 14 supports two fingers 16a and 16b which are pivotally mounted to the carousel arm 14a in a scissor arrangement. This scissor arrangement is spring-loaded by a spring assembly 13. The finger 16a on one carousel arm 14a is connected to an opposing finger 16b mounted on an adjacent carousel arm 14a by a cam 15 such that the opposing fingers 16a/16b can be opened and closed by finger actuator 62. Each opposing finger 16a/16b includes two horizontal pins 17 which face each other for engaging recesses 88 in carrier plate 18 (FIGS. 2 and 3) in order to support carrier plate 18 in the proper location. Carousel 14 is indexed by a servo motor coupled to a gear reducer. A ball barrier 9 is positioned under carousel 14 separating ball feed stations 22, 23, 26, 28 and 30 from stations 32, 34, 36, 38 and 20. This helps keep loose solder balls 102 from contaminating stations 32, 34, 36, 38 and 20.

Figure 3:
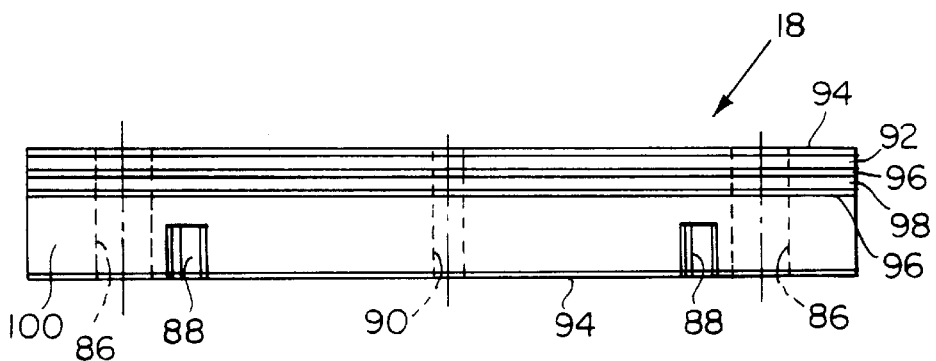
FIG. 3 is a an end view of the carrier plate.
Figure 4:
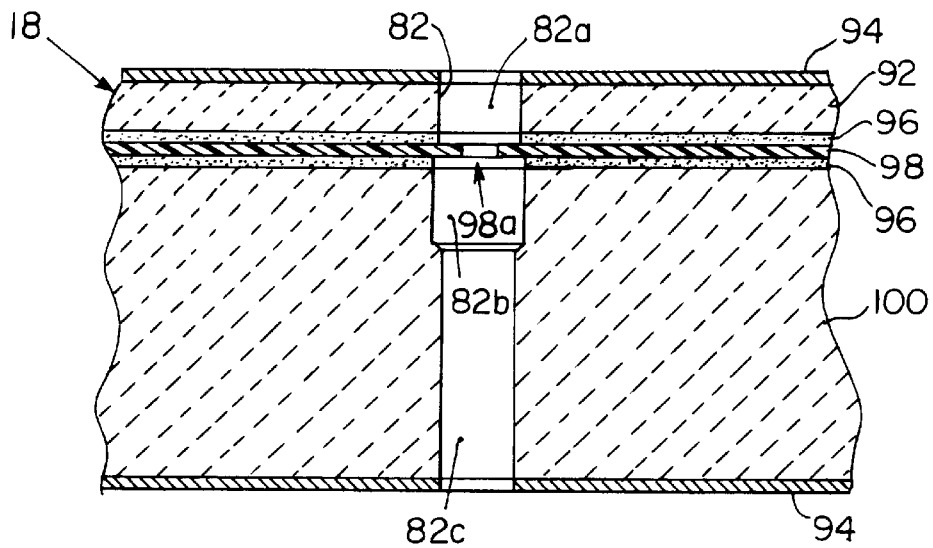
FIG. 4 is a side sectional view of a portion of the carrier plate showing a single hole through the carrier plate.

Referring to FIGS. 2, 3 and 4, carrier plate 18 is formed by laminating a film 98 of resilient plastic, such as Kapton™ between two plates 92 and 100 made of printed circuit board material. Preferably, top plate 92 is about 0.020 inches thick, film 98 is about 0.0005 inches thick and lower plate 100 is about 0.125 inches thick. Top Plate 92, film 98 and lower plate 100 are laminated together with two adhesive layers 96 which are about 0.0005 inches thick. The outer surfaces of plates 92 and 100 are gold plated so that carrier plate 18 can be grounded to prevent static electricity as well as to prevent damage to parts 72. The gold plating also provides easily cleaned surfaces. Carrier plate 18 is preferably about 5 inches long and 2.5 inches wide.

Each hole 82 in array 80 includes a first portion 82a (FIG. 4) within top plate 92 which is about 0.036 inches in diameter for holding a solder ball about 0.030 inches in diameter. Each hole 82 also includes a funnel portion within lower plate 100 having a wider inlet 82b and a narrower outlet 82c which is about 0.032 inches in diameter for precise solder ball placement. Holes 82 are preferably about 0.050 inches apart from each other. The film 98 has an opening 98a formed by slitting the film 98 with two slits crossing at right angles to each other. The film 98 is stiff enough to prevent a solder ball 102 from passing through opening 98a under its own weight but is flexible enough to allow the solder ball 102 to be pushed through by the pins 108 (FIG. 11) of pattern head 104 and ball placement head 126.

Carrier plate 18 includes two alignment holes 90 at opposite ends which are about 0.125 inches in diameter. Alignment holes 90 mate with alignment pins 90a (FIGS. 10 and 18) to align the carrier plate 18 with the pattern head 104 and ball placement head 126. Four holes 86 are located at the corners of carrier plate 18 and are about 0.191 inches in diameter. Holes 86 provide clearance for protruding screw heads extending from pattern head 104 and ball placement head 126. Recesses 88 on the ends of carrier plate 18 receive pins 17 from support fingers 16a and 16b. Recesses 84 located along the sides of carrier plate 18 receive protrusions 71 (FIG. 13) from pattern head grippers 74a/74b and ball placement grippers 127a/127b. Although film 98 is preferably made of Kapton™, other suitable stiff plastic films can be used such as Mylar™. In addition, metallic foils or films can be employed. Furthermore, top plate 92 can be made of metal instead of printed circuit board material. In such a case, the holes 82 through the metallic top plate 92 can be etched. Also, the size of array 80 can be varied depending upon the maximum number of solder balls required for placement on parts 72. For example, the array depicted in FIG. 2 has 441 holes while another common array contains 1089 holes. In fact, array 80 can cover most of carrier plate 18. Multiple arrays 80 can also be formed within carrier plate 18 for multiple parts 72. Finally, the dimensions of carrier plate 18 can be varied depending upon the application at hand, for example, enlarged if used for multiple parts.

Figure 8:
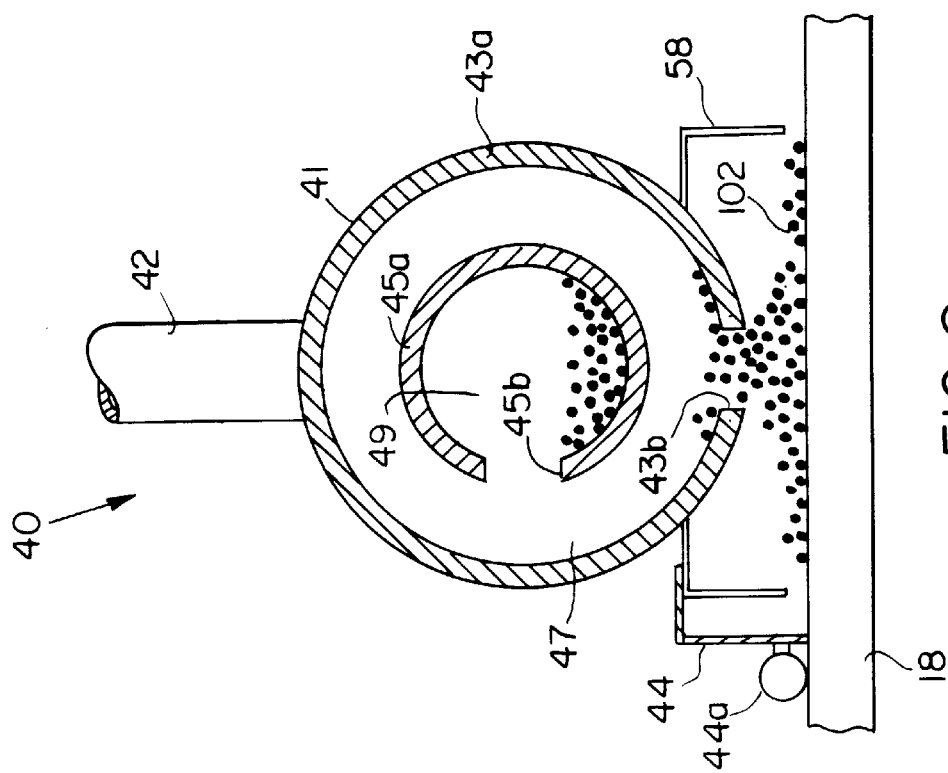
FIG. 8 is a partial sectional view of the ball feed delivering solder balls onto the carrier plate.
Figure 7:
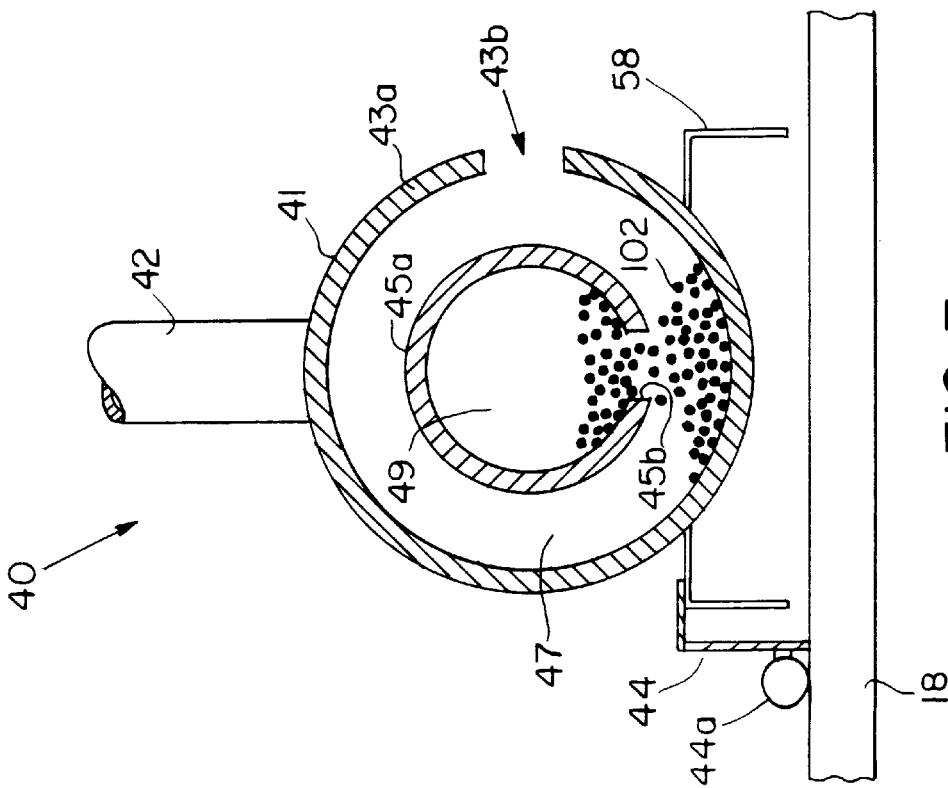
FIG. 7 is a partial sectional view of a ball feed positioned above a carrier plate.

Referring to FIGS. 1, 7 and 8, each ball feed 40 includes a supply tube 42 for supplying the ball feed 40 with solder balls 102. The solder balls 102 travel downwardly by gravity into the inner chamber 49 of feed member 41. The wall 45a surrounding inner chamber 49 has an opening 45b which allows the solder balls 102 to escape into outer chamber 47. The wall 43a surrounding outer chamber 47 has an opening 43b positioned 90° from opening 45b. When feed member 41 is rotated to move opening 43b to face carrier plate 18, the quantity of solder balls 102 held in outer chamber 47 spills onto carrier plate 18 over the array 80 of holes 82. Meanwhile, the opening 45b is rotated to the side such that solder balls 102 are collected within inner chamber 49. Each ball feed 40 includes an enclosure 58 surrounding the ball feed 40 which is positioned sufficiently close to carrier plate 18 to contain most of the solder balls 102 over the array 80 of holes 82. A wiping element 44 positioned at a 45° angle adjacent to ball feed 40 then wipes excess solder balls 102 from the carrier plate 18 as the carrier plate 18 is indexed by carousel 14. Preferably, wiping element 44 is formed from soft compliant clear plastic but, alternatively, can be made of rubber or metal such as aluminum, brass, steel, etc. A wheel 44a provides the proper spacing between wiping element 44 and carrier plate 18. In alternate embodiments, either an air jet can be used to remove excess solder balls 102, or carrier plate 18 can be tilted. Although the ballfeed stations preferably progressively fill carrier plate 18 with solder balls 102, in cases where carrier plate 18 is already filled with the required solder balls 102 before reaching ball feed station 30, apparatus 10 can be programmed to inspect carrier plate 18 as it leaves each ball feed station so that if carrier plate 18 is properly filled with solder balls 102, the carrier plate 18 can bypass the remaining ball feed stations.

Figure 9:
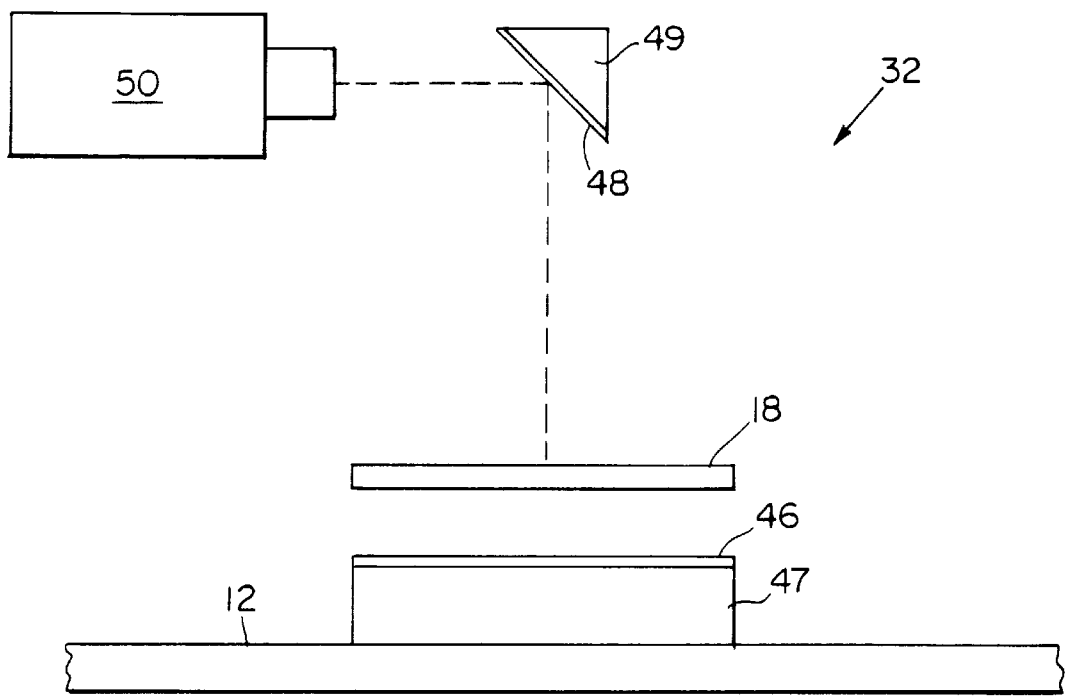
FIG. 9 is a schematic side view of the first sensing system.

Referring to FIG. 9, the first sensing station 32 includes a planar light source 46 which is positioned under carrier plate 18 for backlighting carrier plate 18. Light source 46 is mounted on a flat block 47 positioned on table top 12. Camera 50 is preferably a CCD camera and is horizontally mounted above carrier plate 18. A mirror 48 is mounted above carrier plate 18 at a 45° angle to carrier plate 18 on a bracket 49 which allows camera 50 to view the array 80 of holes 82 on carrier plate 18. Light source 46 provides a pulse of light long enough to allow camera 50 to view array 80. Although camera 50 is preferably positioned horizontally, camera 50 can alternatively be positioned vertically above carrier plate 18. In such a case, mirror 48 is omitted.

Referring to FIGS. 10, 11, 12, and 13, pattern head assembly 52 includes a pattern head 104 mounted to the lower end 124 of pattern head assembly 52. Pattern head 104 has a pattern of vertically positioned pins 108 for pushing an unneeded pattern 83 of solder balls 102 from carrier plate 18 as seen in FIG. 6. The pattern of pins 108 in pattern head 104 is arranged to correspond to pattern 83. The pins 108 are oriented such that end 108a and rounded tip 107 are facing downward. Pins 108 are held in position by plates 110, 112 and 114 which are made of gold-plated printed circuit board material. Plates 110, 112 and 114 are mounted between end pieces 116 and include an array 80 of holes 82 therethrough corresponding to the array 80 of holes 82 on the carrier plate 18. Plates 110 and 112 are spaced apart from plate 114 by two spacers 113. A shoulder 105 on pin 108 is positioned above plate 112 in a cavity between spacers 113 and limits the amount that pins 108 can move up and down. Ends 108b of pins 108 rest against a sandwich formed of hard rubber 118, shim stock 120 and foam 122. This sandwich provides enough movement for each pin 108 to allow the pins 108 to be self-aligning with the corresponding holes 82 within carrier plate 18. A spring-loaded stripper plate 106 is positioned over the tips 107 of pins 108 for protecting pins 108 as well as for keeping them in proper alignment. Stripper plate 106 also includes an array 80 of holes 82 corresponding to those in the carrier plate 18. Stripper plate 106 moves upwardly against plate 110 in the direction of arrow 103 when carrier plate 18 is pushed upwardly against stripper plate 106 by pattern head grippers 74a/74b. Stripper plate 106 keeps carrier plate 18 perpendicular to pins 108 to keep pins 108 from jamming within carrier plate 18. Plates 106, 110, 112 and 114 are gold-plated so that they can be electrically grounded to reduce static electricity as well as to prevent damage to parts 72. Plates 106, 110, 112 and 114 are mounted along two alignment pins 90a such that the array 80 of holes 82 on the plates are in alignment with each other.

Grippers 74a/74b pivot about pivot points 75a and 75b, respectively, to allow grippers 74a/74b to grip and release carrier plate 18 as depicted by arrows 77. Grippers 74a/74b have protrusions 71 (FIG. 13) which engage recesses 84 for aligning carrier plate 18 within grippers 74a/74b. Bottom portions 73a and 73b support carrier plate 18 from the bottom. Grippers 74a/74b slide up and down relative to pattern head 104 and are driven by a crank slider mechanism which in turn is driven by a brushless servo motor coupled through a gear reducer.

In order to remove the pattern of unneeded solder balls 102 from the array 80 of holes 82 in carrier plate 18, carrier plate 18 is brought upwardly in the direction of arrows 101 by grippers 74a/74b. Carrier plate 18 engages and pushes stripper plate 106 upwardly in the direction of arrow 103 such that pins 108 protrude through stripper plate 106. The pattern of pins 108 push a corresponding pattern 83 of unneeded solder balls 102 through carrier plate 18. This leaves behind only a pattern 81 of desired solder balls 102 within array 80 as depicted in FIG. 6.

Figure 15:
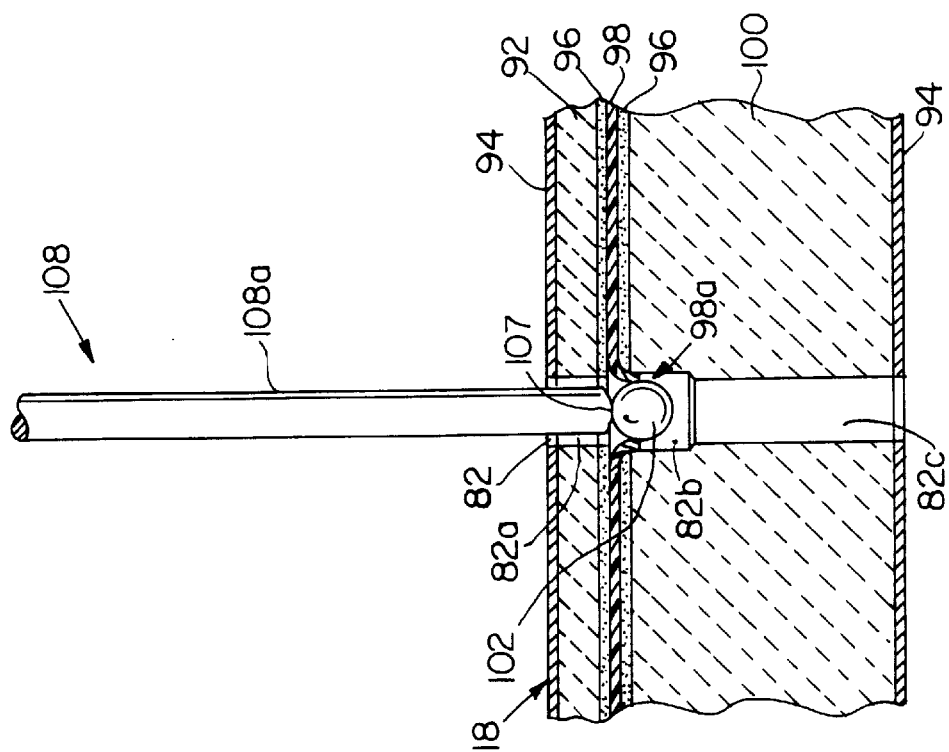
FIGS. 14, 15 and 16 depict a single pattern head pin pushing a solder ball through the carrier plate.
Figure 14:
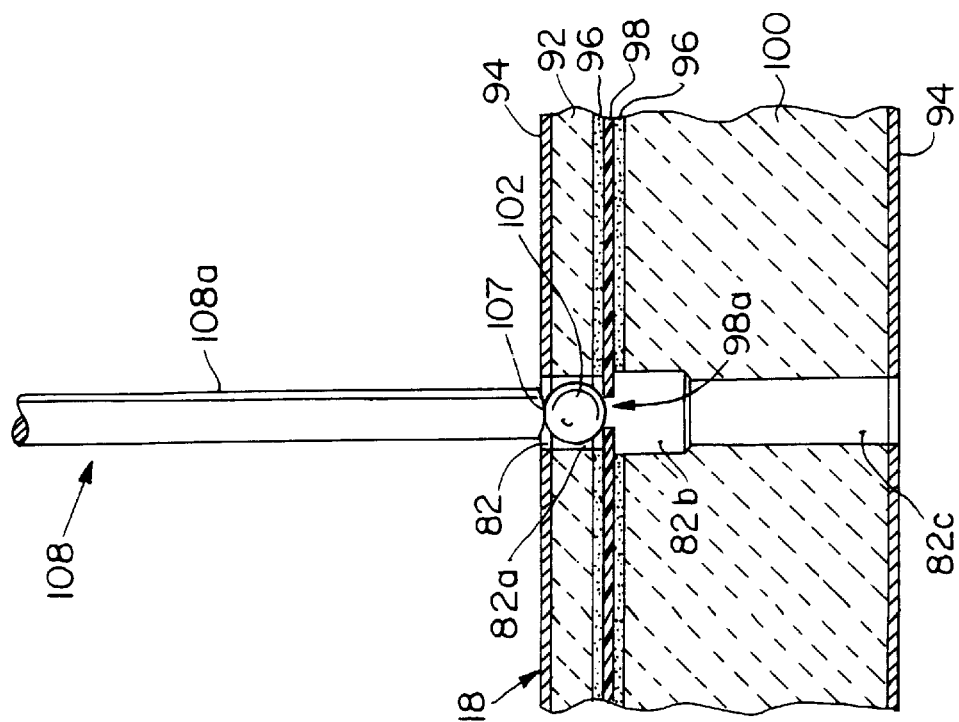
Figure 16:
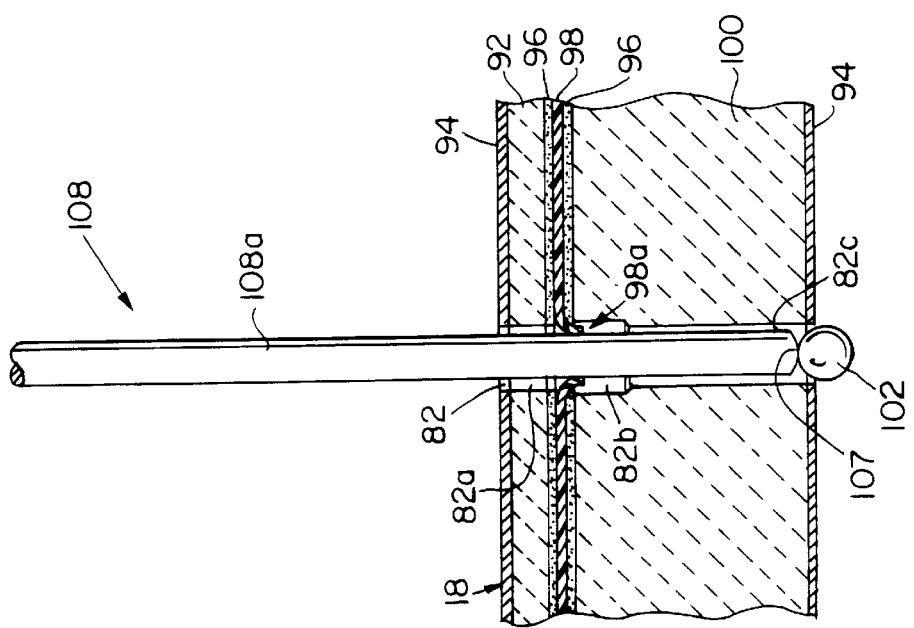

FIGS. 14, 15 and 16 depict a single solder ball 102 pushed through carrier plate 18. Referring to FIG. 14, solder ball 102 is supported within the first portion 82a of hole 82 by film 98. The tip 107 of pin 108 begins to engage solder ball 102. In FIG. 15, pin 108 pushes solder all 102 into the second portion 82b of hole 82. The force of pin 108 causes film 98 to flex downwardly pushing solder ball 102 through opening 98a. In FIG. 16, solder ball 102 is pushed through the third portion 82c of hole 82 by pin 108 and out from carrier plate 18.

By including a full array 80 of holes 82 within plates 110, 112 and 114 of pattern head 104, the configuration of pins 108 in pattern head 104 can be changed to accommodate different parts 72. The advantage of this is that a large variety of parts 72 can be processed without requiring a large inventory of special tooling to be kept: on hand. If a quick change of parts 72 is desired, a second pattern head 104 can be kept on hand so that processing a different part merely requires unbolting and replacing the pattern head 104 on the pattern head assembly 52.

Figure 17:
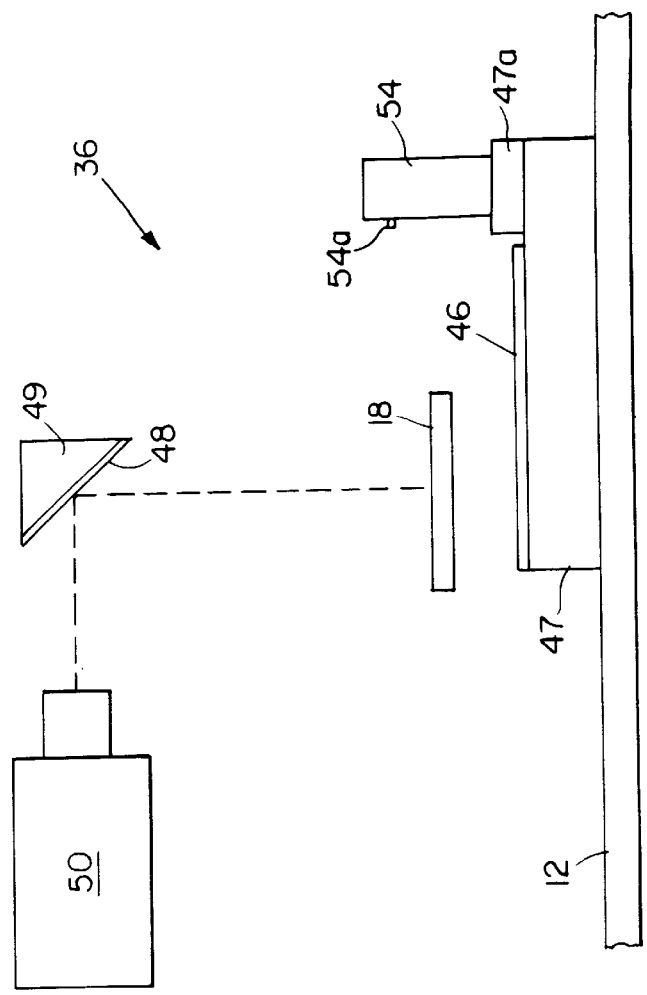
FIG. 17 is a schematic side view of the second sensing system.

Referring to FIG. 17, the second sensing station 36 includes a planar light source 46 positioned below carrier plate 18 for backlighting carrier plate 18. Light source 46 is mounted on block 47. Camera 50 is horizontally mounted above carrier plate 18. A mirror 48 is mounted above carrier plate 18 at a 45° angle with bracket 49. A second light source 54 having a light emitting element 54a is mounted on block 47a above and off to the side of the carrier 18 for front lighting carrier 18. Backlighting the carrier plate 18 with light source 46 allows camera 50 to view whether the solder balls 102 in the array 80 of holes 82 of the carrier plate 18 are in the desired pattern 81 (FIG. 6). Front lighting the carrier plate 18 with light source 54 allows camera 50 to see whether any stray solder balls 102 are resting on top of carrier plate 18 so that the stray solder balls 102 can be removed by an air jet or wipers. Light sources 54 and 46 provide a pulse of light long enough to allow camera 50 to view carrier plate 18.

Figure 10:
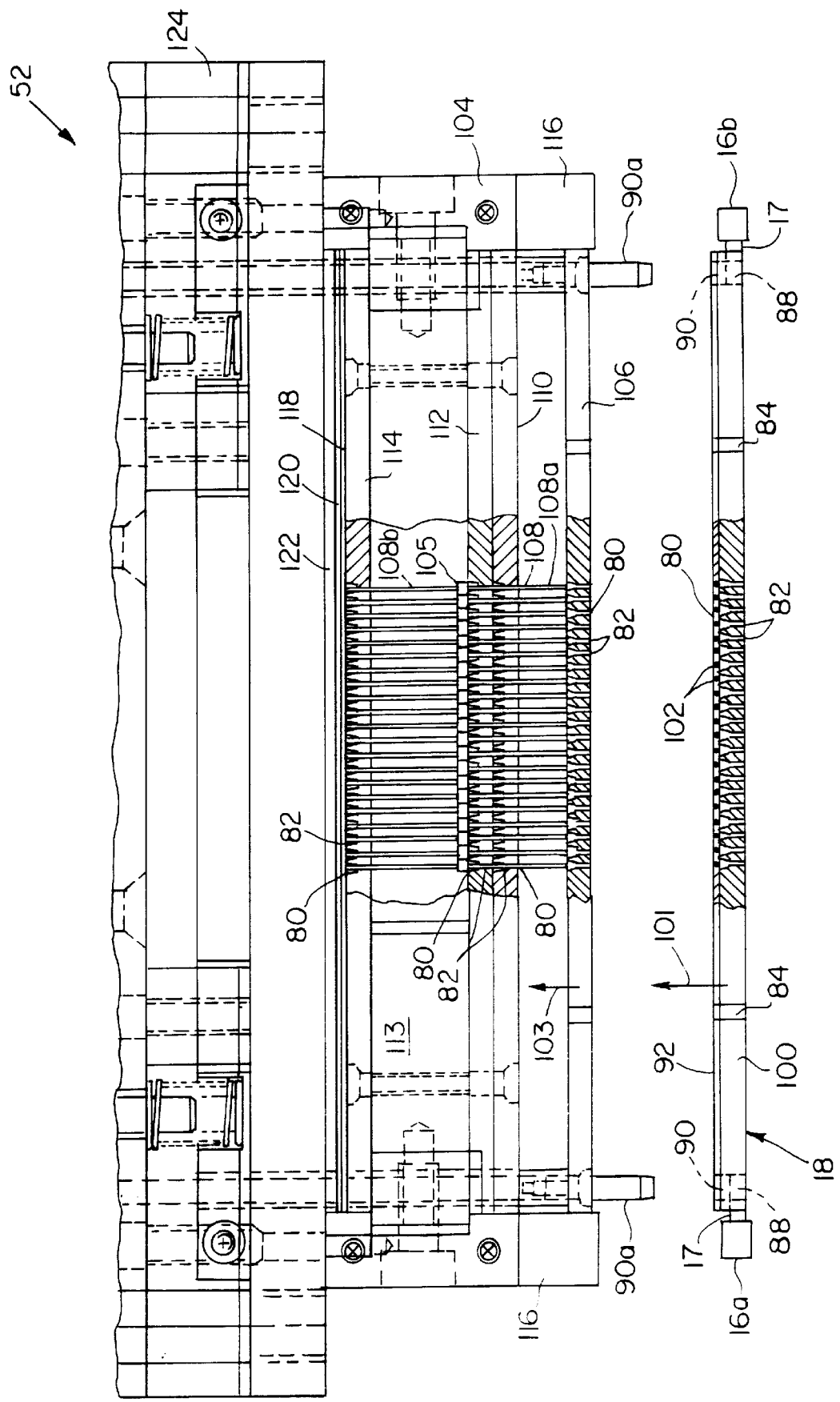
FIG. 10 is a partial side sectional view of the pattern head positioned above the carrier plate.
Figures 11, 13:
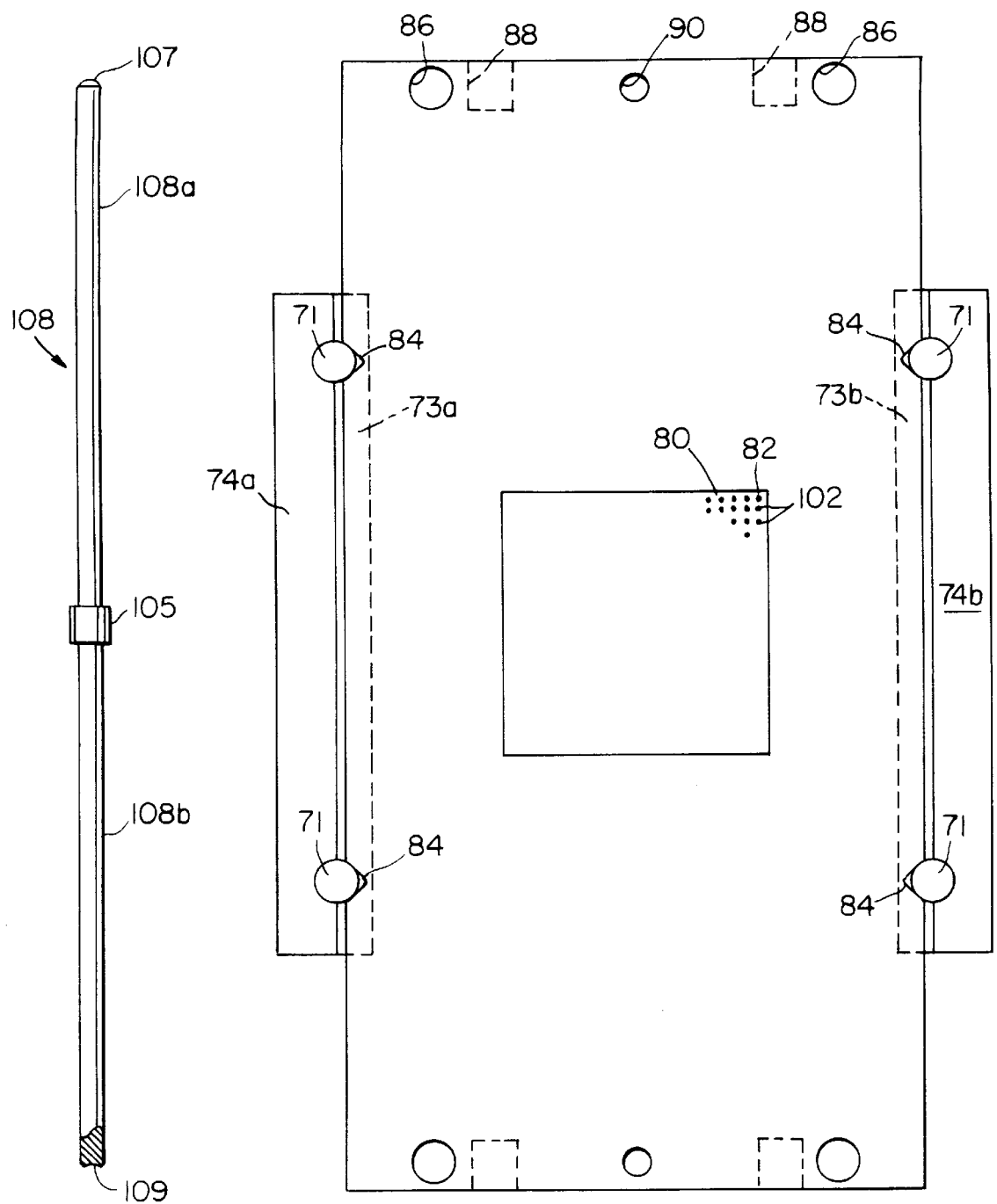
FIG. 11 is a side view of a pattern head/ball placement head pin.
FIG. 13 is a plan view of the carrier plate gripped on the side edges by the pattern head grippers.
Figure 12:
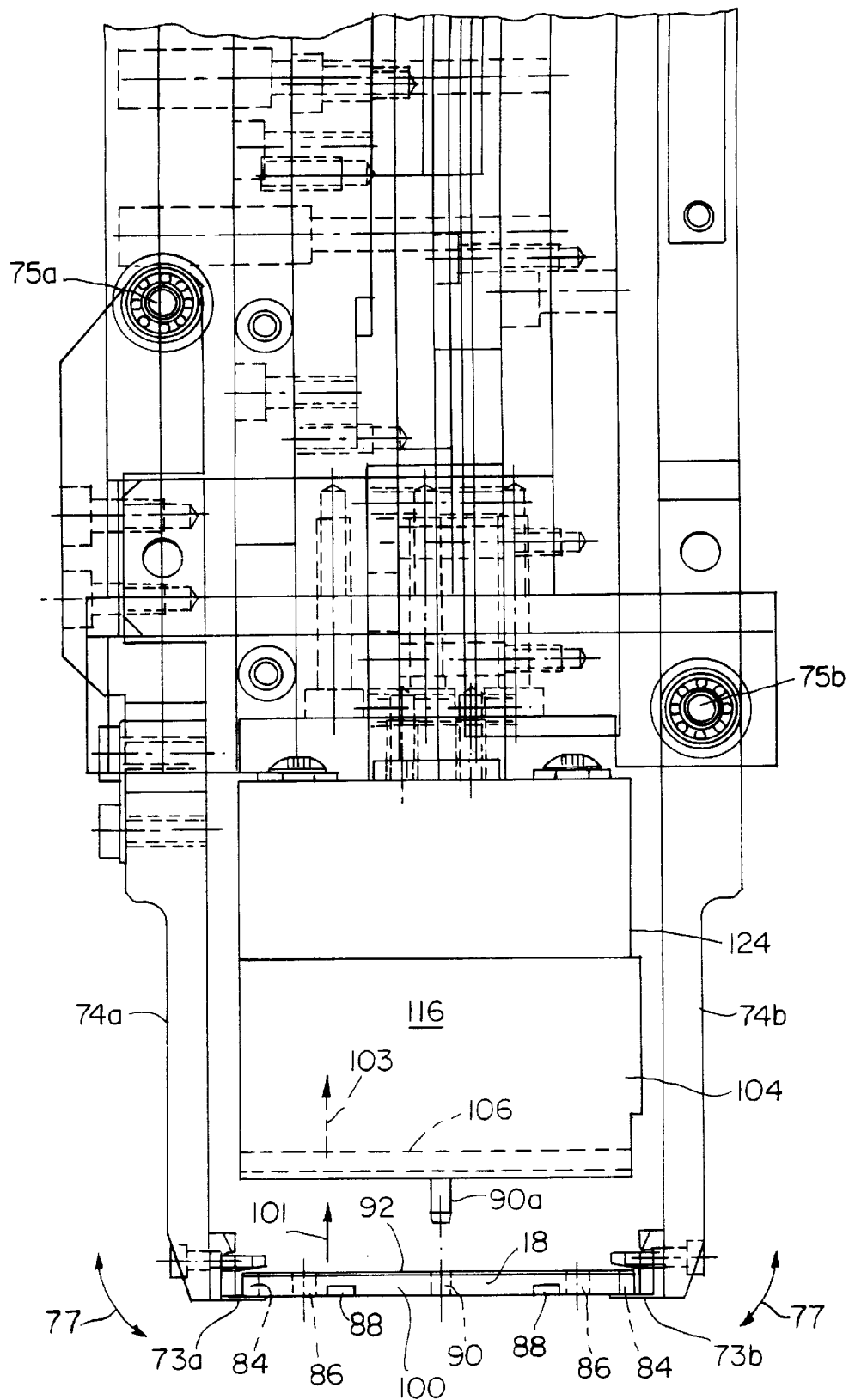
FIG. 12 is an end view of the pattern head assembly in which the carrier plate is held by the pattern head grippers on the side edges of the carrier plate.
Figure 19:
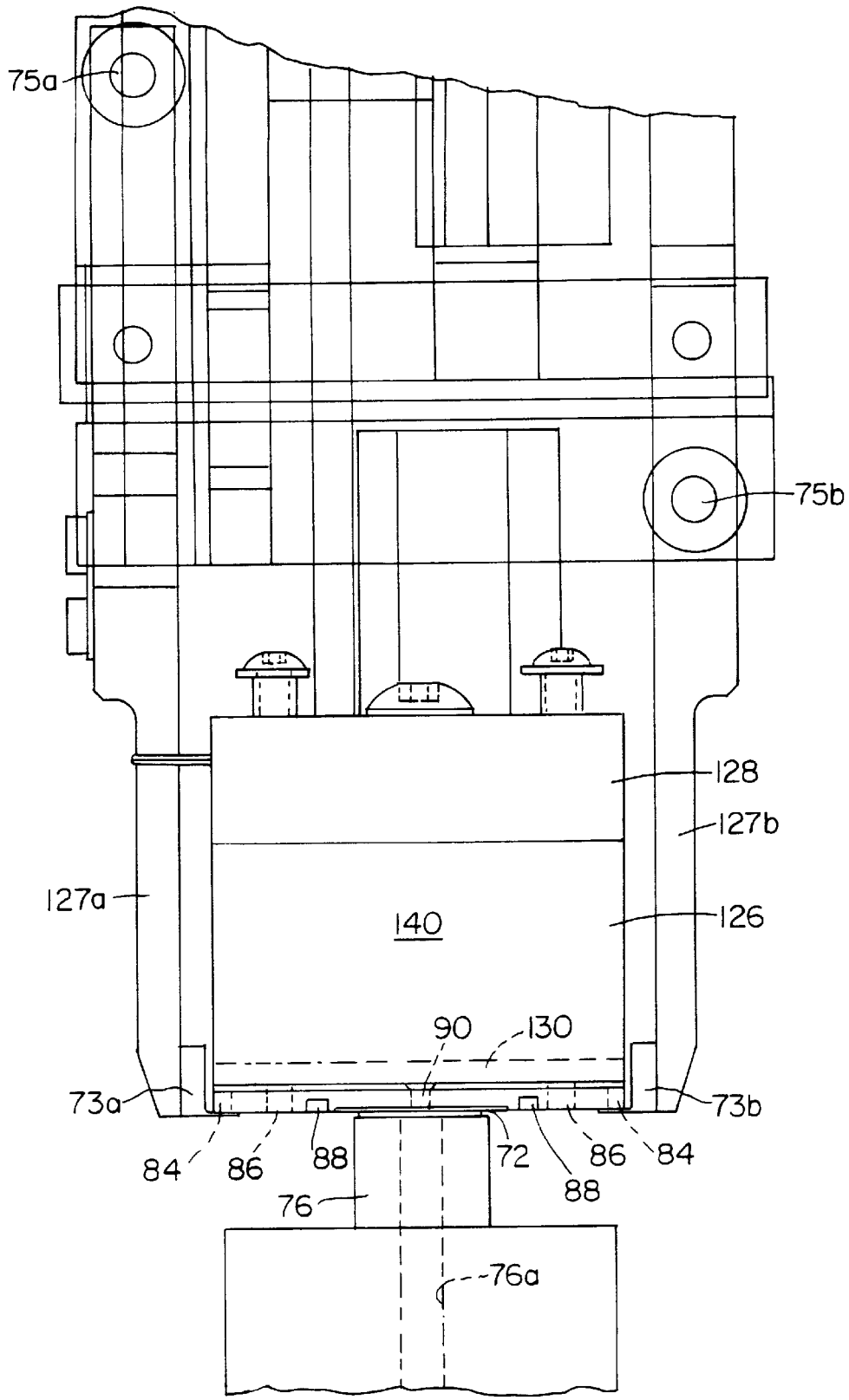
FIG. 19 is an end view of the ball placement head assembly in which the carrier plate is held by the ball placement head grippers on the side edges with a semiconductor substrate being positioned for ball placement by a vacuum chuck.

Referring to FIGS. 18 and 19, ball placement head 126 is mounted to the lower portion 128 of ball placement head assembly 56. Ball placement head 126 includes an array of pins 108 corresponding to the array 80 of holes 82 in carrier plate 18. The ends 108b and tips 109 of pins are positioned downwardly. Tips 109 (FIG. 11) are cup shaped for more accurate placement of solder balls 102. Pins 108 are held in position by plates 132, 134 and 138 which are similar to plates 110, 112 and 114 of pattern head 104. The sandwich of hard rubber 118, shim stock 120 and foam 122 is positioned above pins 108 to allow the pins to be self-aligning and vertically compliant. Two spacers 136 separate plate 138 from plates 132 and 134. Plates 132, 134 and 138 are mounted between end pieces 140. Alignment pins 90a allow carrier plate 18 to be properly aligned with ball placement head 126. A spring-loaded stripper plate 130 protects and aligns the tips 109 of pins 108. Stripper plate 130 is similar to stripper plate 106 (FIG. 10). Ball placement head assembly 56 includes grippers 127a/127b for gripping carrier plate 18 and lowering carrier plate 18 over part 72. Grippers 127a/127b pivot about pivot points 75a and 75b, respectively. Ball placement head 126 and grippers 127a/127b slide up and down relative to ball placement head assembly 56 and are each driver, by a crank slider mechanism similar to that on the pattern head assembly 52. In addition, the vacuum chuck 76 positioned below ball placement head assembly 56 is also driven by a crank slider mechanism.

In operation, after grippers 127a/127b lower carrier plate 18 over part 72, ball placement head 126 then moves downwardly relative to carrier plate 18. As stripper plate 130 engages carrier plate 18, stripper plate 130 is pushed upwardly thereby exposing pins 108. The tips 109 of pins 108 engage the pattern 81 of solder balls 102, pushing them downwardly through carrier plate 18 onto part 72. Since pins 108 are vertically compliant, pins 108 can, compensate for an uneven or slightly tilted surface of part 72. Once the solder balls 102 are in position, the carrier plate 18 and the ball placement head 126 are moved upwardly.

Figure 21:
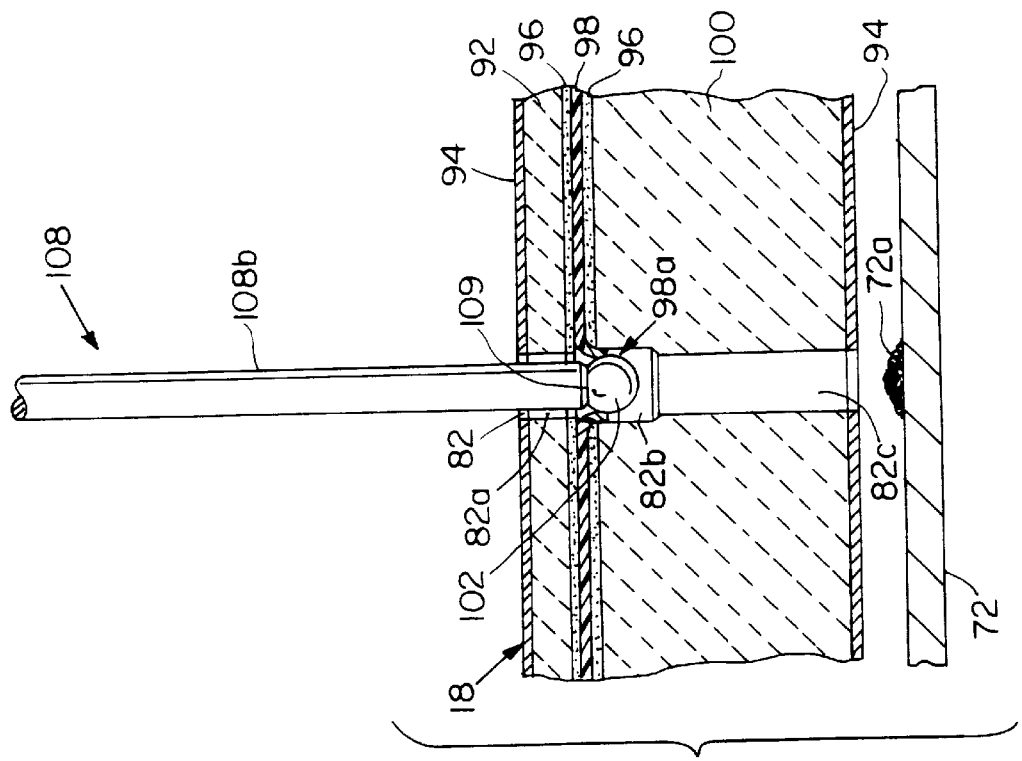
FIGS. 20, 21, 22 and 23 depict a single ball placement head pin pushing a solder ball from the carrier plate onto a semiconductor substrate.
Figure 20:
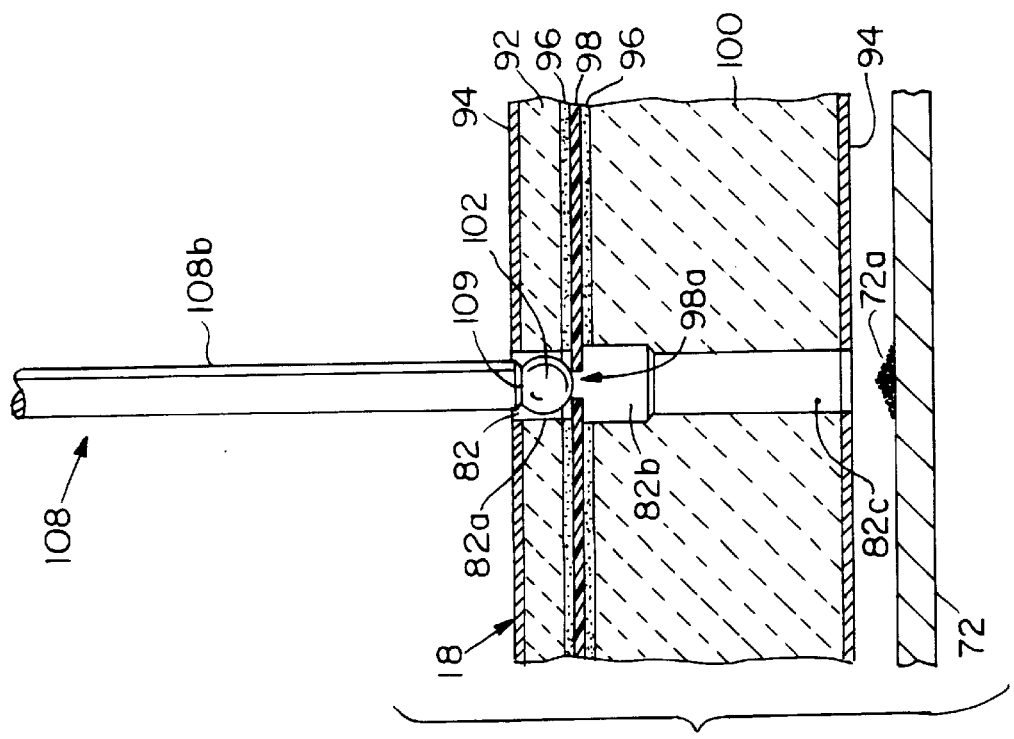
Figure 23:
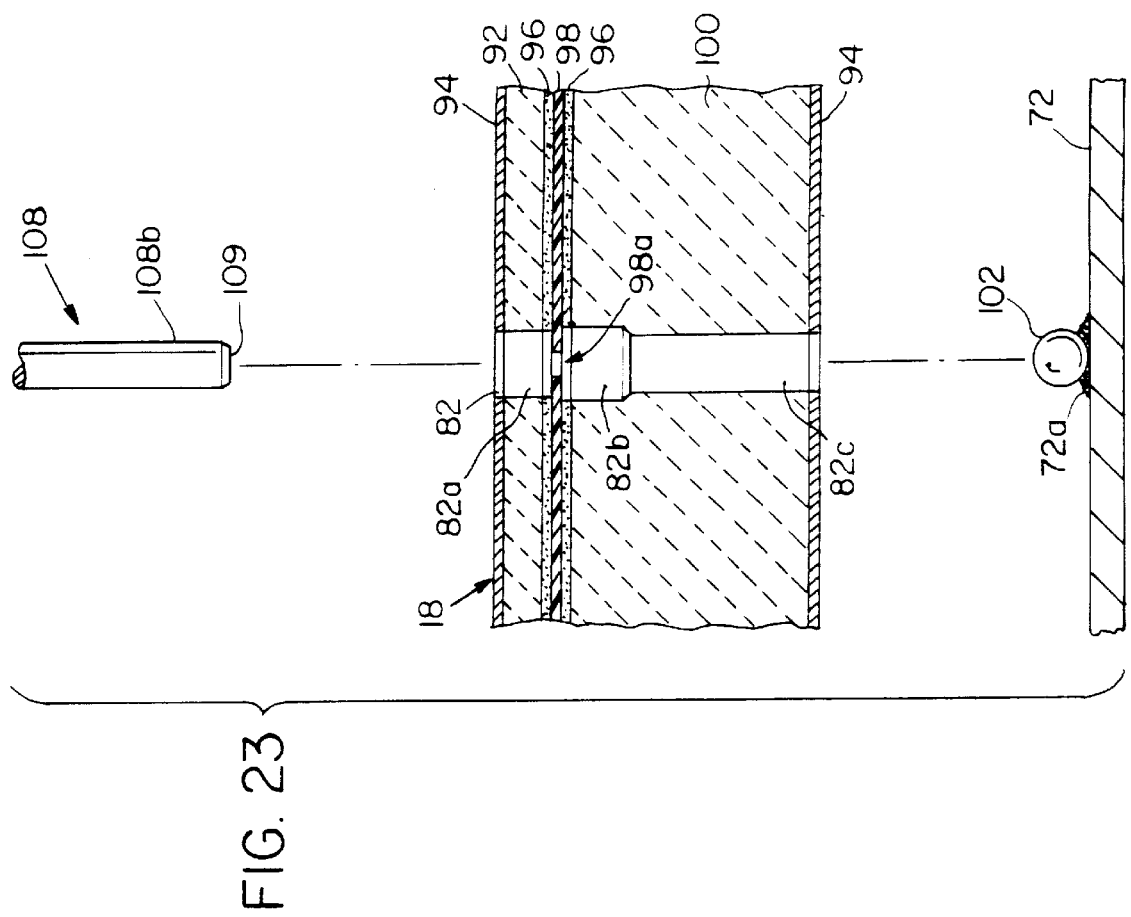
Figure 22:
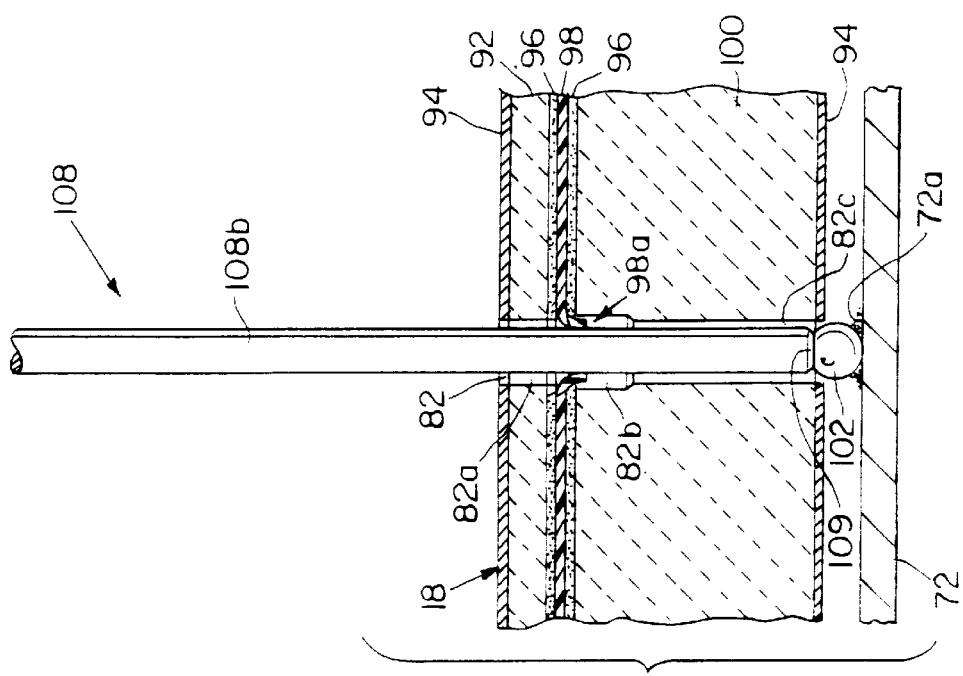

FIGS. 20, 21, 22 and 23 depict a single solder ball 102 pushed through carrier plate 18 onto part 72. Referring to FIG. 20, carrier plate 18 is positioned above part 72. A blob of flux 72a is positioned below hole 82. Solder ball 102 is supported within the first portion 82a of hole 82 by film 98. The tip 109 of pin 108 begins to engage solder ball 102. In FIG. 21, pin 108 pushes solder ball 102 through opening 98a in film 98 into the second portion 82b of hole 82. In FIG. 22, solder ball 102 is pushed through the third portion 82c of hole 82 onto the blob of flux 72a on part 72. The flux 72a causes solder ball 102 to stick to part 72. In FIG. 23, pin 108 and carrier plate 18 are moved upwardly away from part 72. In situations where flux is not needed, blobs of inert material can be used to cause solder balls 102 to stick to part 72.

Although carrier plate 18 and ball placement head 126 both preferably include a generic array 80 of holes 82 and pins 108 requiring the use of the pattern head 104 to create the desired pattern 81 of solder balls 102, alternatively, carrier plate 18 and ball placement head 126 can have an array of holes 82 and pins 108 which correspond to the exact desired pattern of solder balls 102 to be placed upon part 72. In such a case, sensing station 32 and pattern head station 34 can be omitted. However, in order to accommodate different parts, carrier plates and ball placement heads having the exact configuration for each different part must be kept on hand.

Figure 24:
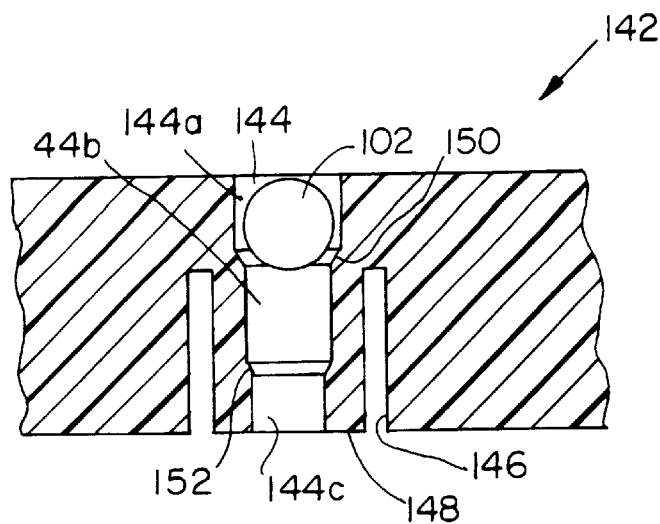
FIG. 24 is a side sectional view of a portion of another preferred carrier plate.
Figure 25:
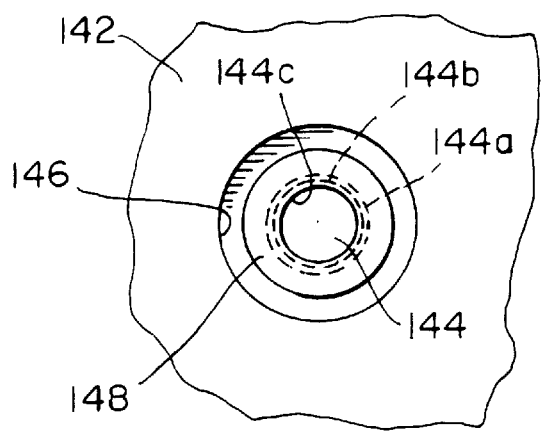
FIG. 25 is a bottom view of a portion of the carrier plate of FIG. 24.

Referring to FIGS. 24 and 25, carrier plate 142 is another preferred carrier plate. Carrier plate 142 differs from carrier plate 18 in that it is made from one material. An array of holes 144 are formed through carrier plate 142. Each hole 144 has a first portion 144a for capturing a solder ball 102. A second portion 144b with a smaller diameter than first portion 144a is capable of resiliently holding a solder ball 102 if pushed into the second portion 144b by a pin 108. This allows carrier plate 142 to be preloaded with solder balls 102 on a separate machine than the ball placement machine because the carrier plate 142 can be transported and even held upside down without losing the solder balls 102. Splitting the operation of apparatus 10 into two different machines would increase the speed at which solder balls 102 can be placed onto parts 72. A concentric slot 146 on the bottom of carrier plate 142 forms a thin wall 148 surrounding second portion 144b and a third portion 144c. This allows the second portion 144b to expand when the solder ball 102 is pushed in. The third portion 144c has a diameter smaller than second portion 144c and resiliently expands to allow solder ball 102 to pass through when pushed by a pin 108. Carrier plate 142 is preferably formed of plastic but, alternatively, can be made of metal or a lamination.

Figure 26:
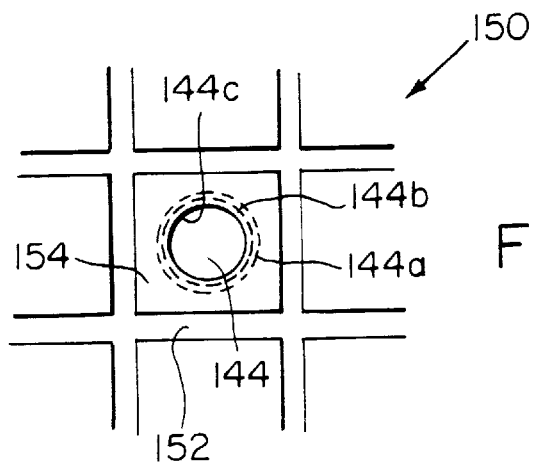
FIG. 26 is a bottom view of a portion of still another preferred carrier plate.

Referring to FIG. 26, carrier plate 150 is another preferred carrier plate which differs from Carrier plate 142 in that the bottom of carrier plate 150 has criss-crossing slots 152 forming a thin wall portion 154 about the second 144b and third portions 144c of hole 144. Slots 152 are preferably molded into the carrier plate 150 but, alternatively, can be saw cut. In another preferred embodiment, the second section 144b of holes 144 can be omitted with the solder balls being held within carrier plate 150 by static electricity.

EQUIVALENTS

While this invention has been particularly shown and described with references to preferred embodiments thereof, it will be understood by those skilled in the art that various changes in form and details may be made therein without departing from the spirit and scope of the invention as defined by the appended claims.

For example, other preferred embodiments of apparatus 10, can have less than five ball feed stations. In such a case, the omitted ball feed stations can be replaced with additional pattern head stations such that different patterns of solder balls 102 can be placed upon different semiconductor substrate parts without making any mechanical changes. The support fingers 16a/16b can also be fixed and spaced apart from each other by an opening large enough for ball placement head 126 to move downwardly therethrough. In this arrangement, only five carrier plates 18 are employed. Also, although the stations in apparatus 10 have been shown to be arranged in a circle, the stations can be arranged in a straight line. In such a case, a linear actuator would move carrier plate 18. In addition, although apparatus 10 has been described for depositing solder balls 102 onto individual parts 72, apparatus 10 can also be used for depositing solder balls 102 onto strips or panels. Other containers for holding parts 72 can be employed such as the Auer™ Boat. Finally, solder balls having dimensions differing than those described above can be deposited upon parts 72. In such a case, the dimensions of the components of apparatus 10 should be altered accordingly.

What is claimed is:

1. A method of placing solder balls on a substrate comprising:

providing a carrier plate having a series of holes therethrough and a lateral bottom support such that each hole is capable of holding a solder ball; and pushing a first pattern of solder balls from the holes in the carrier plate to the substrate with a ball placement head, the ball placement head having a first pattern of flexible protrusions, at least a portion of the first pattern of protrusions being aligned with the first pattern of solder balls held by the carrier plate.

2. The method of claim 1 in which the support is a moveable support structure, the method further comprising the step of causing the moveable support structure to release the solder balls by pushing the protrusions against the solder balls.

3. The method of claim 1 further comprising the step of providing the support with a film capable of supporting the solder balls within the holes, the film being dimensioned to prevent passage of the solder balls through the film by gravity while allowing passage through the film when pushed by the protrusions of the ball placement head.

4. A method of placing solder balls on a substrate comprising the steps of:

providing a carrier plate having a series of holes, each hole capable of holding a solder ball; and pushing a pattern of solder balls from the carrier plate to the substrate with flexible protrusions of a ball placement head that are aligned by an alignment member.

5. A method of placing solder balls on a substrate comprising the steps of:

providing a carrier plate having a series of holes, each hole capable of holding a solder ball and a moveable lateral bottom support for releasably holding said solder ball; and engaging the carrier plate with placement head means having flexible protrusions to push a pattern of solder balls from the carrier plate to the substrate.

6. The method of claim 1 further comprising the step of providing the support with the capability of movement for releasing the solder balls.

7. The method of claim 1 further comprising the step of self aligning the protrusions with the holes.

8. The method of claim 1 further comprising the step of providing the protrusions with vertical compliance.

9. The method of claim 1 further comprising the step of aligning the protrusions with the series of holes with an alignment plate, the protrusions extending through the alignment plate and the alignment plate being retractable relative to the protrusions.

10. The method of claim 1 further comprising the step of aligning the ball placement head with the carrier plate with a mechanical guide located on one of the carrier plate and the ball placement head.

11. A method of placing solder balls onto a substrate comprising:

providing a carrier plate having a series of holes therethrough and a lateral bottom support, each hole for holding a solder ball; and pushing a first pattern of solder balls through the holes in the carrier plate onto the substrate with a ball placement head, the ball placement head having a first pattern of flexible protrusions, at least a portion of the first pattern of protrusions being aligned with the first pattern of solder balls held by the carrier plate.

12. A method of placing solder balls in contact with a substrate comprising the steps of:

providing a carrier plate including a series of holes therethrough, each hole for holding a solder ball; and pushing a first pattern of solder balls from the holes in the carrier plate and into contact with the substrate with a ball placement head, the ball placement head having a first pattern of flexible protrusions that are aligned by an alignment member, at least a portion of the first pattern of protrusions being aligned with the first pattern of solder balls held by the carrier plate.

13. A method of placing solder balls in contact with a substrate comprising the steps of:

providing a carrier plate including a series of holes therethrough, each hole for holding a solder ball; and pushing a first pattern of solder balls from the holes in the carrier plate and into contact with the substrate with a ball placement head, the ball placement head having a first pattern of flexible protrusions, at least a portion of the first pattern of protrusions being aligned with the first pattern of solder balls held by the carrier plate.

* * * * *

UNITED STATES PATENT AND TRADEMARK OFFICE
CERTIFICATE OF CORRECTION

| | | |
|---|---|---|
| PATENT NO. | : 6,170,737 B1 | Page 1 of 1 |
| DATED | : January 9, 2001 | |
| INVENTOR(S) | : Richard F. Foulke et al. | |

It is certified that error appears in the above-identified patent and that said Letters Patent is hereby corrected as shown below:

<u>Title page,</u>
Related U.S. Application Data, amend as follows,
Continuation of application No. 08/795,543, filed Feb. 6, 1997, now abandoned, delete "now abandoned" and insert -- pending --.

Signed and Sealed this

Thirtieth Day of April, 2002

*Attest:*

*Attesting Officer*

JAMES E. ROGAN
*Director of the United States Patent and Trademark Office*